(12) United States Patent
Langenbach et al.

(10) Patent No.: US 7,319,363 B2
(45) Date of Patent: Jan. 15, 2008

(54) METHOD AND CIRCUIT FOR CONTROLLING AMPLIFICATION

(75) Inventors: Stefan Langenbach, Nuremberg (DE); Nebojsa Stojanovic, Munich (DE)

(73) Assignee: CoreOptics, Inc., Nuremberg (DE)

( * ) Notice: Subject to any disclaimer, the term of this patent is extended or adjusted under 35 U.S.C. 154(b) by 0 days.

(21) Appl. No.: 10/554,889

(22) PCT Filed: Apr. 23, 2004

(86) PCT No.: PCT/EP2004/004337

§ 371 (c)(1),
(2), (4) Date: Jan. 25, 2007

(87) PCT Pub. No.: WO2004/098051

PCT Pub. Date: Nov. 11, 2004

(65) Prior Publication Data

US 2007/0109053 A1    May 17, 2007

(30) Foreign Application Priority Data

Apr. 28, 2003   (EP) ................................. 03009564

(51) Int. Cl.
  *H03G 3/10*   (2006.01)
(52) U.S. Cl. ........................ 330/279; 330/129; 330/133
(58) Field of Classification Search ................ 330/279, 330/129, 133
See application file for complete search history.

(56) References Cited

U.S. PATENT DOCUMENTS

| | | | | |
|---|---|---|---|---|
| 5,680,075 A | * | 10/1997 | Sacca | 330/279 |
| 6,417,730 B1 | * | 7/2002 | Segallis et al. | 330/129 |
| 6,657,488 B1 | * | 12/2003 | King et al. | 330/9 |
| 6,753,727 B2 | * | 6/2004 | Magoon et al. | 330/9 |

* cited by examiner

*Primary Examiner*—Patricia Nguyen
(74) *Attorney, Agent, or Firm*—Howard M. Gitten; Edwards, Angell, Palmer & Dodge LLP (57) ABSTRACT

This invention relates to a method for controlling an amplification within a receiver. The gain of a variable gain amplifier which amplifies an input signal to obtain a gain-controlled signal is set. Said gain controlled signal is analog-to-digital converted. Thereby digital words are generated. Each digital word has a value out of a plurality of possible digital values. Digital words having a value within a first and a second subset of the possible digital values are counted in order to generate a first and a second counter value. The gain is set in accordance with the first and second counter values in a fashion that all counter values are as equal as possible. Furthermore, this invention is related to a circuit to be used within a receiver for adjusting the gain of a variable gain amplifier in order to ensure a proper analog-to-digital conversion.

10 Claims, 4 Drawing Sheets

METHOD AND CIRCUIT FOR CONTROLLING AMPLIFICATION

The present invention relates to a method and a circuit according to the preamble parts of claims 1 and 6, respectively. In particular the invention relates to the automatic gain control in digital receivers e.g. for optical data transmission.

Such a method and circuit are described in U.S. Pat. No. 3,931,584 titled "AUTOMATIC GAIN CONTROL".

Communication systems are designed to provide reliable transmission of information, whereby they should be able to combat various channel imperfections. In digital communication systems, the most important parameter for the signal quality measurement surely is BER (bit error rate). The signal at the receiver end contains the data and clock information to be extracted. The amplitude of the received signal is attenuated, whereby the attenuation depends on length and type of the transmission channel. Due to varying power level of both wired and wireless digital transmitted signals, an automatic gain control circuit (AGC) is customary placed before a CDR (clock and data recovery) circuit, which comprises a clock recovery circuit (CR), an analog-to-digital converter (ADC) and a sampling circuit, which receives the recovered clock from the clock recovery circuit.

Automatic gain control is widely employed to adjust the amplification of an input signal in such a way that an output signal has a substantially constant signal level in terms of root mean square, mean or peak values. Most digital communication systems must accommodate received signal levels varying within a range of some tens of dB. However, the power level variation of the AGC output signal should be as low as possible and at least within a range of less than one dB.

In U.S. Pat. No. 3,931,584 inventors present an AGC separated in two circuits one for coarse and the other for fine gain control. In order to adjust the amplification of the fine AGC, the sign and most significant bit in a digital word that an ADC circuit produces are monitored. An exclusive-OR (XOR) operation is performed on the sign and most significant bit in order to detect zero-one and one-zero combinations which indicate high positive and low negative values in a two's compliment system. Then the zero-one and one-zero combinations are counted within a period of time. According to this document it will be apparent to those skilled in the art that any combination of the digits can be counted to control the amplification of the AGC. A comparator compares the count with a threshold value. If the count is less than the threshold value the fine AGC increases the power level and vice versa. Thereby amplification of the input signal is set to a level that the highest and lowest digital words approach the maximum and minimum, respectively, level expressible by the digital words. So the quantization noise of the converter is reduced by maximizing the number of digital words that are available to express the signal amplitude.

This method has the shortcomings that the threshold value depends on the communication channel conditions such as noise power, noise distribution, dispersion etc. In case of very distorted channels like wavelength division multiplexing (WDM) or wireless channels the conventional methods might provide sub-optimal or even very bad performance. In time-variant channels, the measurement of channel performance and selection of new thresholds for obtaining optimal decoding performance increase the AGC circuit complexity. These measurements are hardly feasible for very distorted channels. The receiver developed for such channels have to utilize either a channel equalizer or strong ECC (error correcting code) or a combination thereof.

It is the object of this invention to present a method and circuit for controlling amplification within a receiver in order to arrive at an optimized BER.

This object is achieved by the subject matter of the independent claims.

Preferred embodiments of the invention are the subject matters of the dependent claims.

Following the de-facto conventions in the literature the terms "optimal" or "optimized" are used in a somewhat loose sense. What is meant is that a solution of minimized BER is sought within some practical framework or solution space, not excluding the case that in a slightly modified framework even lower BER might be achieved.

Grouping more than one possible digital value into subsets advantageously reduces the number of counters required and consequently reduces circuit complexity.

Minimizing a uniformity parameter provides an efficient method for adjusting the amplification to achieve a close to minimum BER even for highly distorted, time-variant signals. This technique can be applied to non-Gaussian time-variant channels in the presence of linear and nonlinear distortion.

Defining a first, inner subset and a second, outer subset and comparing the counter values of the inner and outer subsets avoid a minimum search. The amplification is increased if the inner subset is greater than the counter value of the outer subset.

The difference of the counter value of the inner subset minus the counter value of the outer subset constitutes a control parameter, which can be advantageously used together with popular control algorithms like a proportional-plus-integral-plus-derivative controller (PID controller) or fuzzy controllers.

In the following preferred embodiments of this invention are described referring to the accompanying drawings.

| Abbreviations | |
|---|---|
| ADC: | analog-to-digital converter |
| AGC: | automatic gain control |
| BER: | Bit error rate |
| CDR: | clock and data recovery |
| CR: | clock recovery |
| ISI: | Intersymbol interference |
| MLSE: | Maximum-likelihood sequence estimator |
| WDM: | wavelength division multiplexing |
| XOR: | exclusive-OR |
| ECC: | Error correcting code, error correction circuit |
| EQ: | digital equalizer |
| VGA: | variable gain amplifier |

| Mathematical Symbols | |
|---|---|
| $a_i$: | digital word |
| $b_j$: | quantized sample at time j |
| $c_q$: | count of subset $S_q$ |
| f: | symbol rate |
| fg: | fine gain control signal |
| i: | digital word index, $1 \leq i \leq 2^n$ |
| j: | time index, $1 \leq j \leq M$ |
| M: | number of samples |
| $k_q$: | expected number of samples in subset $S_q$ |
| l: | number of subsets |
| $m_c$: | coarse gain parameter |
| $m_u$: | uniformity parameter |
| n: | ADC resolution in bit |
| p: | index for uniformity parameters $m_u$ |
| q: | subset index, $1 \leq q \leq l$ |
| S: | complete set |
| $S_c$: | coarse gain subset |
| $S_q$: | subset |
| t: | time |
| T: | period sample |
| $T_i$: | idle period |

While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

Several counters are introduced, some used for the coarse AGC unit and some others used for fine AGC adjustment, as described in the following.

Since the gains of the coarse and fine AGC units are controlled by other elements it may be more appropriate to designate these units as variable gain amplifiers (VGA). AGC and VGA will be used synonymously in the following.

Implementation

An excellent AGC capability can be realized by using several AGC units. Typically a coarse AGC unit has a wider dynamic rage than a fine AGC unit, which provides for a more accurate gain control. In one embodiment, the coarse AGC unit is controlled in accordance with conventional practice. A peak detector detects either only positive peaks or positive and negative peaks in the output signal of the coarse AGC unit and adjusts its amplification accordingly. In particular it is detected when that the output signal of the coarse AGC unit exceeds a positive threshold or exceeds the positive threshold and falls below a negative threshold for a predetermined portion of time.

In another embodiment, which is described in connection with FIG. 1, the coarse AGC unit can also be controlled by signal generated in a logic unit or a DSP (digital signal processing) circuit. At start-up, the coarse AGC unit can quickly bring a total gain into working regime and after that the fine AGC would adjust finally the gain providing the minimum BER at the output of the digital equalizer or other decoding circuit.

More specifically, after power-up the gain of the fine AGC is set to some relaxed initial value, which is an intermediate gain value that is neither close to the maximum nor to the minimum gain of the fine AGC unit in order to allow positive and negative gain adjustments. Then, in an coarse adjustment phase only the gain of the coarse AGC unit is adjusted to bring the input signal of the following ADC into the working regime i. e. a coarse gain parameter $m_c$ remains above some lower threshold. When the input signal has reached the working regime, the gain of the coarse AGC unit remains fixed whereas the gain of the fine AGC unit optimizes the level of the input signal to arrive at a minimum BER during normal operation. The receiver may re-enter into the coarse adjustment phase in order to re-adjust the coarse AGC unit, when the gain of the fine AGC unit reaches either its maximum or minimum. During the coarse adjustment phase the gain of the coarse AGC unit is adjusted in such a way that a coarse gain parameter $m_c$ always remains above some lower threshold. The most difficult situation expected in an optically amplified DWDM system is when many channels are switched-away or are added at the same time in an optical add/drop multiplexer (ADM) which causes large power transients in optical amplifiers. When re-entering into the coarse adjustment phase, the gain of the fine AGC is again set to its relaxed initial value and the gain of the coarse AGC unit is adjusted to bring the total gain into the working regime as explained above.

Figure 1:
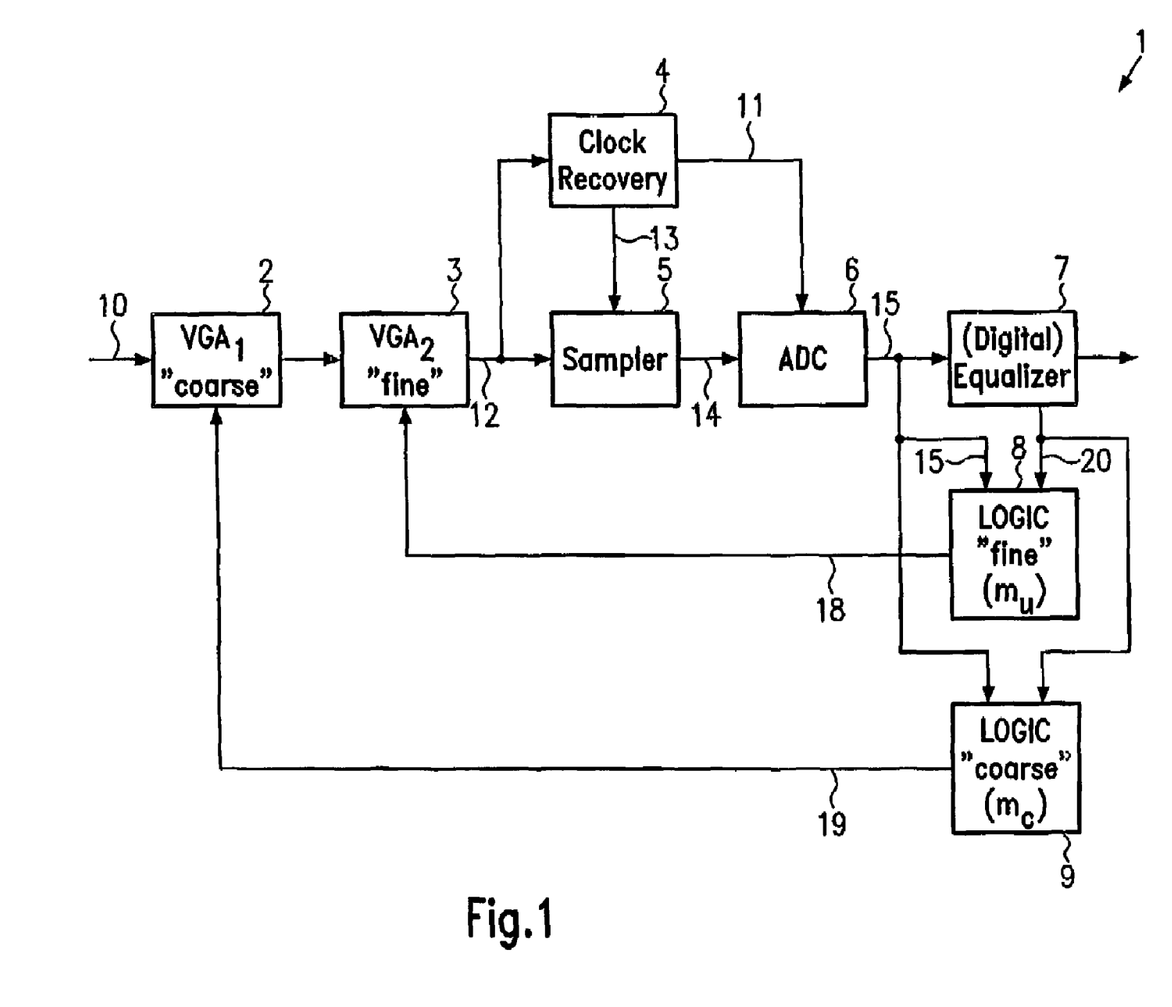
FIG. 1 shows a block diagram of the relevant units of a receiver according to this invention.

FIG. 1 shows a block diagram of the relevant units of a receiver according to this invention. It comprises a coarse VGA unit 2, a fine VGA unit 3, a clock recovery (CR) 4, a sampler 5, an ADC 6, an digital equalizer 7 and a fine logic unit 8 and a coarse logic unit 9. The input signal 10 that is input into the coarse VGA unit 2 represents the transmitted signal as distorted by the channel at the receiver end. It may be the output signal of an antenna in the case of radio communication or the output signal from an optical-to-electrical interface in the case of optical data transmission.

The signal at the input of the clock recovery circuit 4 must be strong enough. However, it is even more critical to provide sampler 5 and ADC 6 with a signal having optimal strength In order to arrive at a minimum BER. To this end coarse and fine VGA 2 and 3 amplify the input signal and generate a gain controlled signal 12 which is input into CR circuit 4 and sampler 5. CR circuit 4 recovers the symbol clock and provides control signals on lines 13 and 11 to sampler 5 and ADC 6. These control signals already have an appropriate phase relation to the gain-controlled signal 12. Such clock recovery circuits are described in "Integrated Fiber-Optic Receivers" by A. Buchwald, K. W. Martin, Kluwer Academic Publishers, 1995. It is noted that ADC 6 and sampler 5 could be reversed in sequence.

Figure 2A:
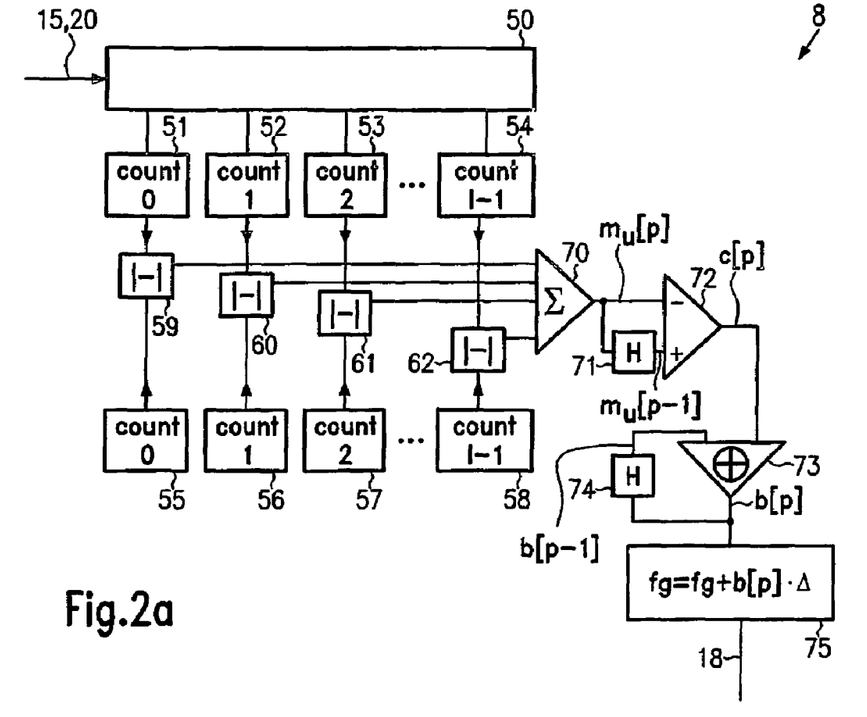
FIG. 2a shows a detailed block diagram of a first embodiment of the fine logic unit.
Figure 2B:
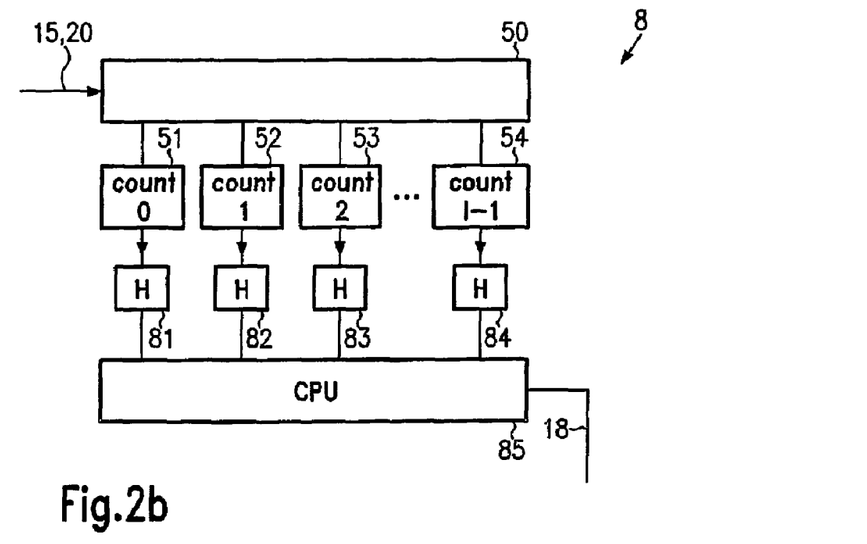
FIG. 2b shows a detailed block diagram of a second embodiment of the fine logic unit.

The sampler 5 essentially comprises a sample-and-hold circuit, which samples the gain-controlled signal 12 at appropriate points in time and outputs a constant signal on line 14 to the ADC until the next sampling is performed. The ADC provides its output in form of digital words on line 15 to digital equalizer 7 and fine and coarse logic unit 8 and 9. The digital equalizer 7 preferably combats ISI and consequently provides equalizer functionality. The fine logic unit 8 essentially calculates statistics of the digital words provided by the ADC 6 and generates a fine gain control signal on line 18 to control the gain of fine VGA 3. The coarse logic unit 9 operates in a similar fashion and generates a coarse gain control signal on line 19 to control the gain of coarse VGA 2. The operation of the coarse and fine logic unit 8 and 9 will be explained in more detail below. Two embodiments of fine logic unit 8 are shown in FIGS. 2a and 2b.

In another embodiment sampler 5 and ADC 6 may perform over-sampling. As a consequence, more than one digital words are provided on line 15 for each symbol comprised in the input signal 10. In this case, digital equalizer 7 may reduce the over-sampled digital words to one digital word per symbol and provide this data on line 20 to logic units 8 and 9 or alternatively the over-sampled digital words may be processed directly by the logic units.

ADC 6 has $2^n$ quantization levels, where each sample is represented by n bit. The $2^n$ different quantization levels are mapped into a set S of digital words, denoted by $S=\{a_i\}$, $i=1, 2, \ldots, 2^n$. Let the subscript i of the digital word $a_i$ represent the amplitude level of the quantized sample in value order, i.e. $a_1 < a_2 < \ldots < a_2 n$.

In a particular interval of time MT the DSP counts the occurrences of each possible word, by using $2^n$ counters. Here M is the number of all words in this interval and T is the symbol period being the reciprocal of the symbol rate of transmission, f.

For counting samples of certain amplitude a simple indicator (counting) function defined by equation (1) is used:

$$\delta_a(x) = \begin{cases} 1, & x = a \\ 0, & x \neq a \end{cases} \quad (1)$$

The coarse AGC utilizes a coarse gain parameter $m_c$ indicating the amplified output signal strength. For this purpose, we introduce a subset $S_c$ of S, representing the set of digital words or quantizer levels that are relevant for indicating signal strength. This parameter $m_c$ is obtained by equation (2):

$$m_c = \sum_{a_i \in S_c} \sum_{j=1}^{M} \delta_{a_i}(b_j) \quad (2)$$

$b_j$ is the quantized sample at discrete time index j. For many channels a good choice is to use $S_c = \{a_2 n\}$. In contrast, for optical channels or generally for binary channels with signal-dependent noise $S_c = \{a_1, a_2 n\}$ provides satisfactory performance. Note that the latter choice can also be applied for other channels, without loss in performance.

During any coarse adjustment phase the coarse logic unit 9 compares the parameter $m_c$ with one or more thresholds and generates a signal for reducing or increasing the coarse gain accordingly. Consequently, the coarse AGC ensures that the signal has sufficient power, in the specified limits.

The fine AGC 2 will be adjusted by a uniformity parameter $m_u$, indicating the uniformity of the distribution of discrete amplitudes. To this end the set S of all quantization levels is partitioned into I disjoint subsets (equation (3)), with $2 \leq I \leq 2^n$:

$$S = S_1 \cup S_2 \cup S_I \quad (3)$$

To each subset $S_q$ an integer number $k_q$ is associated. $k_q$ represents the expected number of times a quantization level in the subset $S_q$ will be expected in M observations or samples. Since each sample is associated with exactly one subset equation (4) holds:

$$\sum_{q=1}^{I} k_q = M \quad (4)$$

Normally, to achieve uniformity, $k_q$ should be chosen as M/I. With additional knowledge about the channel, better performance may possibly be achieved with a slightly non-uniform choice of values $k_q$.

The uniformity parameter $m_u$, controlling the fine AGC unit, is defined by equation (5):

$$m_u = \sum_{q=1}^{I} \left| \left( \sum_{a_i \in S_q} \sum_{j=1}^{M} \delta_{a_i}(b_j) \right) - k_q \right| \quad (5)$$

With suitable selection of parameters, in particular $k_q$, minimum BER can be achieved by minimizing the uniformity parameter $m_u$. An inappropriate selection of parameters can lead to local minima, which make it hard to find the best gain value, producing the lowest number of errors.

FIG. 2a shows a possible implementation of fine logic unit 8. FIG. 2a shows a distribution circuit 50, counters 51 to 54, absolute difference circuits 59 to 62, registers 55 to 58, adder 70, comparator 72, holding circuits 71 and 74, exclusive-OR (XOR) gate 73 and fine gain calculation circuit 75. The digital words provided by ADC 6 on line 15 or digital equalizer on line 20 are input into distribution circuit 50. Distribution circuit 50 compares each digital word to a plurality of digital values the digital words may assume in order to associate each digital word to one of the subsets $S_q$, $1 \leq q \leq I$. To each of the subsets $S_q$ one of the counters 51 to 54 is associated. Distribution circuit 50 generates a clock pulse for every digital word it receives in order to increment the counter associated with the subset to which the digital word belongs. Additionally, for each subset one absolute difference circuit and one register is provided. Each of the absolute difference circuits calculates the absolute value of the difference of the counter value minus the register value of the counter and the register to which the absolute different circuit is connected to. In each of the registers one number $k_q$, $1 \leq q \leq I$ is stored. Adder 70 adds the outputs of all absolute different circuits. Consequently, distribution circuit 50, counters 51 to 54, absolute difference circuits 59 to 62, registers 55 to 58 and adder 70 implement equation (5). Therefore, the output of adder 70 constitutes the uniformity parameter $m_u$.

The counters 51 to 54 count M digital words input into distribution circuit 50 during a period of MT wherein T is the symbol period. Then a uniformity parameter $m_u[p]$ is calculated at time $t_p$ and the counters are reset.

Holding circuit 71 stores the previously calculated uniformity parameter $m_u[p-1]$ which has been calculated at time $t_{p-1} = t_p - MT$ wherein $t_p$ is the present time. In addition, the calculation of the uniformity parameter $m_u$ may take some idle time $T_i$ during which digital words are ignored on lines 15 or 20. If $T_i$ is different from 0, $T_i$ must be added to MT but, for simplicity, it is assumed to be 0 in the following discussion. Comparator 72 compares the newly calculated uniformity parameter $m_u[p]$ with the previously calculated uniformity parameter $m_u[p-1]$ in order to output control signal $c[p] \in \{-1, 1\}$. Control signal c[p] is input into XOR circuit 73. It generates a timing signal $b[p] \in \{-1, +1\}$ to be used for gain phase adjustment. Timing signal b[p] is feed back to the other input of XOR circuit 73 via holding circuit 74 in order to delay timing signal b[p] by MT. Consequently the XOR circuit 73 XORs c[p] and b[p-1]. Table 1 depicts its functionality.

TABLE 1 functionality of XOR circuit 73

| c[p] | b[p − 1] | b[p] |
|---|---|---|
| −1 | −1 | 1 |
| −1 | 1 | −1 |
| 1 | −1 | −1 |
| 1 | 1 | 1 |

Practically, minimizing the uniformity parameter $m_u$ and consequently the gain adjustment works in a dithering mode. During operation this circuit adjusts the gain in a way that the uniformity parameter $m_u$ dithers around its minimum.

The new value of the fine gain control signal is obtained by using equation (6):

$$fg[p]=fg[p-1]+b[p]\Delta \qquad (6)$$

In equation (6) fg[p−1] represents the previous or old fine gain control signal and $\Delta$ represents an adjustment step of the fine gain control signal. Equation (6) is implemented in fine gain calculation circuit 75. The fine gain control signal fg is provided via line 18 to fine VGA 3 which updates the gain. After some fine gain adjustments, the gain range will be reached, and subsequently tracked, which corresponds to the minimum uniformity parameter $m_u$ and BER.

In an alternate embodiment XOR circuit 73 may be a conventional logic circuit inputting either logic 1s or 0s and outputting 0s or 1s. In this embodiment equation 6 must be modified in that previous fine gain control signal fg[p−1] is increased by $\Delta$ if b[p] is 1 and previous fine gain control signal fg[p−1] is decreased by $\Delta$ if b[p] is equivalent to 0 in fine gain calculation circuit 75.

FIG. 2b shows a second embodiment of fine logic unit 8. In contrast to the first embodiment shown in FIG. 2a the elements 55 to 75 are replaced by holding circuits 81, 82, 83, 84 and microprocessor 85. Upon processing M samples by distribution circuit 50 and counters 51 to 54, the counter values are stored in holding circuits 81 to 84. Then the counters are reset and are ready for processing the next M samples. Microprocessor 85 then reads out the values of the holding circuits 81 to 84 and calculates a uniformity parameter $m_u$ in compliance with equation (5). Then the microprocessor performs the functionality of holding circuit 71, comparator 72, XOR circuit 73, holding circuit 74 and fine gain calculation circuit 75 as described in connection with FIG. 2a.

As will be explained later in connection with the simulation result a typical value for M is 120000. As a consequence the required operating frequency of distribution circuit 50 and counters 51 to 54 is substantially higher than the operation frequency of microprocessor 85. Although microprocessor 85 has to perform not only a single operation in order to calculate equation (5) and perform the minimum search a substantial difference in operation speed of roughly a factor 1200 remains for M equivalent to 120000 provided that the processing of the counter values takes 100 microprocessor clock cycles. So even for high-speed applications a general-purpose microprocessor 85 having a moderate clock frequency can be used. The application of standard microprocessors reduces development costs and receiver costs especially for small batch sizes.

The holding circuits 81 to 84 may be omitted if microprocessor 85 is quick enough to enter all counter values within a short time or a certain number of samples are discarded in an idle period $T_i$ between the blocks of M samples which are counted. In the idle period the microprocessor 85 may read out the counter values.

In another embodiment the counter values are read out by microprocessor 85 one after another in a distance smaller than MT/I. Then each counter value is reset. In this embodiment the periods of time each counter evaluates are shifted with respect to each other. Since it is assumed that the symbols do not appear in a certain pattern but rather are statistically independent this shift may be acceptable.

In a third embodiment, which is not shown in a figure, the quantized samples may be directly input into a microprocessor which performs the function of elements 50 to 75 shown in FIG. 2a. Such a circuit structure can be applied only to moderate transfer rates due to operation speed limitation of the microprocessor 85. In this embodiment counters 51 to 54 may be implemented simply by registers which are incremented by an adder logic.

In a further embodiment subsampling may be performed, i.e. not each sample but rather only e.g. each second or third sample is processed and counted.

Figure 3:
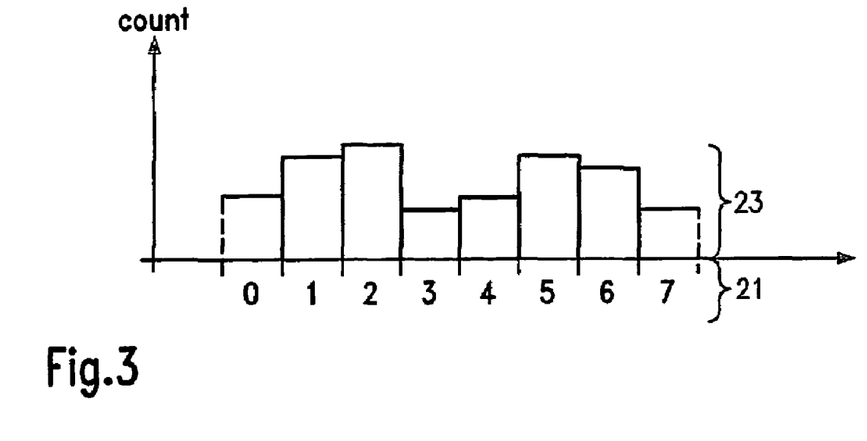
FIG. 3 shows a statistic of digitized sample values.

FIG. 3 shows a statistic of digitized sample values in the form of a bar graph. The possible digital words 21 are plotted on the x-axis. It is assumed that ADC 6 performs a 3-bit digitization. As a consequence the possible digital words range from 0 to 7. The area 23 of each bar illustrates the number of occurrences of a specific digital word within a sequence of M digital words. Such a statistic could be obtained if one counter is provided for each digital word.

Figure 4:
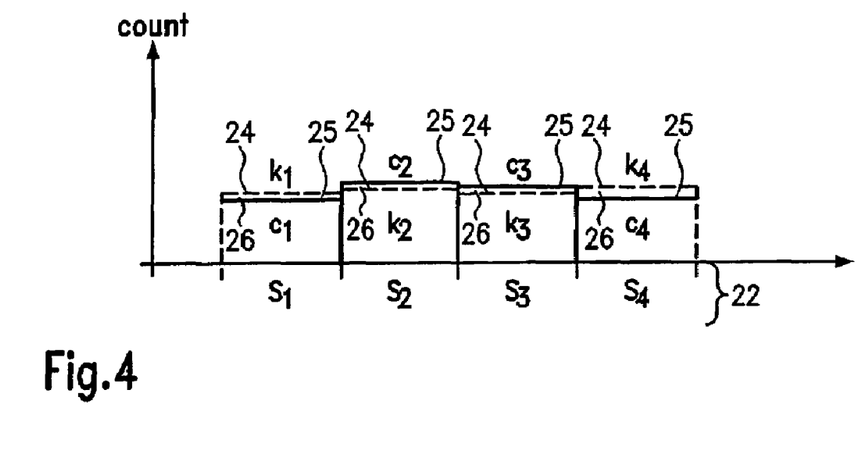
FIG. 4 illustrates counter values for the statistics of FIG. 3 for a first subset.

FIG. 4 illustrates counter values for the statistics of FIG. 3 for a first subset. The set S of all possible digital words is subdivided into four subsets 22. The first subset $S_1$ comprises the digital words 0 and 1, the second subset $S_2$ the digital words 2 and 3, the third subset digital words 4 and 5 and the fourth subset the digital words 6 and 7. The area of the bars having a solid upper boundary represents the counter value of a counter for the respective subset. As a consequence the area of the bar for subset $S_1$ in FIG. 4 should be equivalent to the area of the bars for digital words 0 and 1 in FIG. 3. The broken lines 24, more specifically the area of the bars defined by the broken lines, illustrates the constant values $k_1$, $k_2$, $k_3$, $k_4$ which are subtracted from the counter values in order to obtain difference values. As explained in connection with equation (5) the absolute values of the difference values are added in order to obtain the uniformity parameter $m_u$. The absolute values of the difference values are represented by the area of the stripes 26 between the solid and the broken lines.

Figure 5:
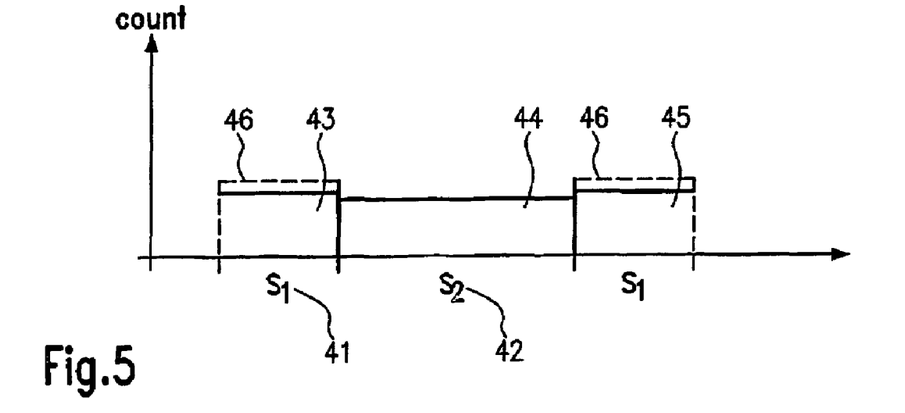
FIG. 5 illustrates counter values for the statistics of FIG. 3 for a second subset.

FIG. 5 illustrates the choice of two subsets in a further embodiment of this invention. The set S of possible digital values is subdivided into an outer subset $S_1$, 41 and an inner subset $S_2$, 42. The outer subset $S_1$ comprises the digital words 0, 1, 6 and 7 whereas the inner subset $S_2$ comprises the digital words 2 to 5. It may be said that the inner subset is chosen in a manner that the difference between any digital word comprised in the inner subset and the average of all digital words is smaller than the absolute difference between any digital word comprised in the outer subset and the average. The average of all digital words in the example explained in connection with FIGS. 3 to 5 is 4. A uniformity parameter in this embodiment may be calculated by equation (7):

$$m_u = \sum_{a_i \in T_2} \sum_{j=1}^{M} \delta_{a_i}(b_j) - \sum_{a_i \in T_1} \sum_{j=1}^{M} \delta_{a_i}(b_j) - k_1 \quad (7)$$

As in FIGS. 3 and 4, the area of bars 43 and 45 represents the count of digital words within the first subset and the area of bar 44 represents the count of digital words in the second subset. The broken lines 46 represent an offset $k_1$. The uniformity parameter $m_u$ defined by equation 7 may assume both, positive and negative values. In a preferred embodiment in each adjustment step, the fine gain is changed by a value proportional to the uniformity parameter. Provided that the offset value $k_1$ is not too big, this is tantamount to saying that the amplification is increased if the count associated with the inner subset is greater than the count of the outer subset.

The uniformity parameter defined in equation 7 is suitable for being processed by a proportional-integral-differential controller or a fuzzy controller since no minimum search is required.

Simulation

The performance of the method has been simulated for the case of an optical channel distorted by chromatic dispersion and noise. In this example, a MLSE algorithm has been applied for digital equalization, and the parameters utilized in simulation have been selected as:

M=120'000 three bit quantization, n=3, $2^n$=8

Figure 6:
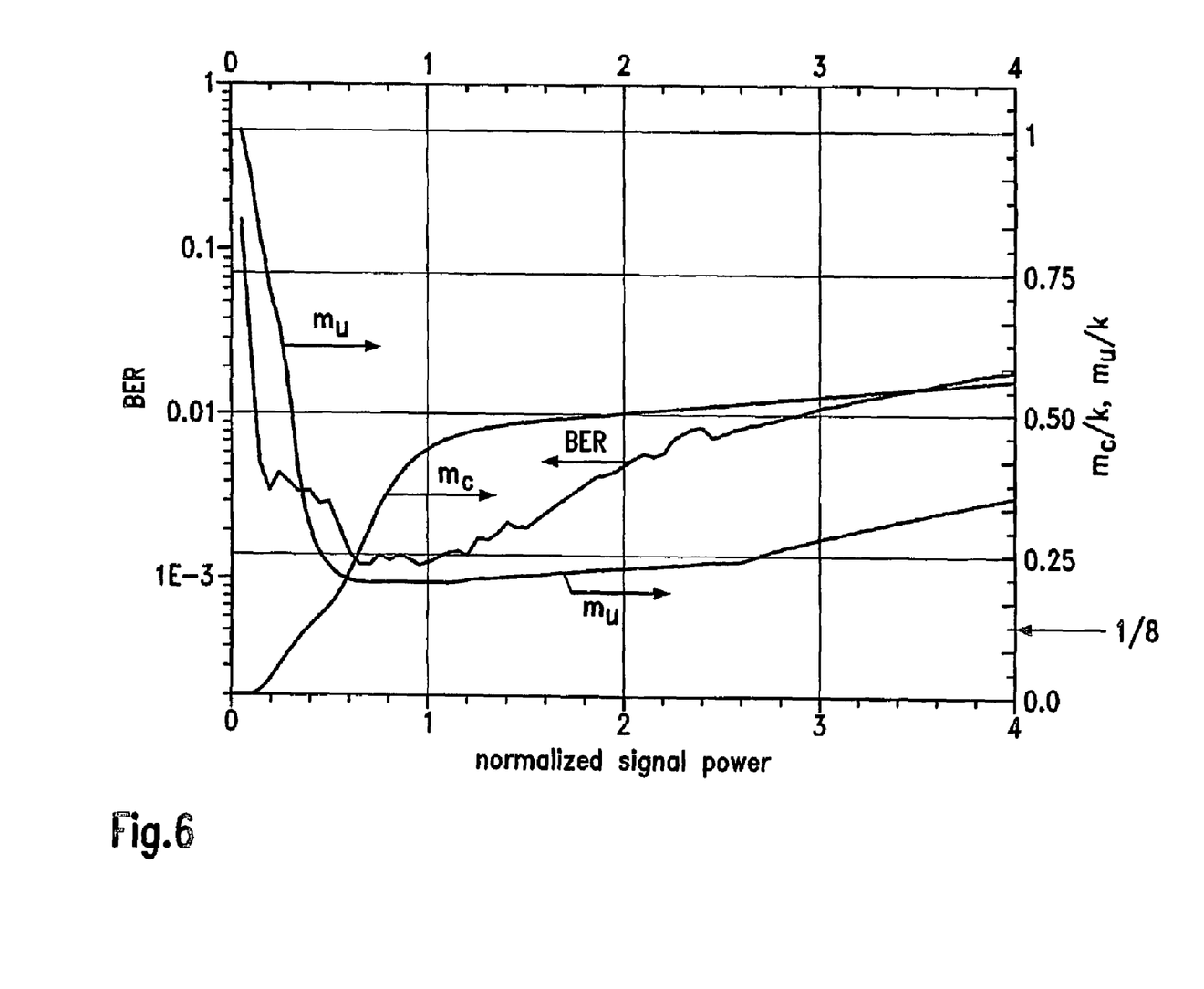
FIG. 6 shows simulation results.

$S_c=\{a_1,a_8\}$ $m_c>M/8(M/8=15'000)$ $S=S_1 \cup S_2 \cup S_3 \cup S_4$, $S_1=\{a_1,a_2\}$, $S_2=\{a_3,a_4\}$, $S_3=\{a_5, a_6\}$ and $S_4=\{a_7,a_8\}$ $k_q=M/4(M/4=30'000)$, $1 \leq q \leq 4$ The simulation results are shown in FIG. 6. In this graph, the coarse gain parameter $m_c$, the uniformity parameter $m_u$ and the BER are plotted against the normalized signal power. In the low signal power regime e. g. below 0.2 normalized signal power, the digital equalizer 7 produces high BER due to existing unoccupied outer quantization levels. By increasing the signal power, the sequence estimator arrives at the region of the best BER for normalized signal power between 0.6 and 1.2. For the normalized signal power between 0.6 and 1.2 the parameter $m_u$ reaches the minimum value and the parameter $m_c$ is greater than M/8=15'000. Further increasing the signal power leads to the quantization overloading that causes an increase of the BER.

As explained above, the gain of the coarse VGA unit 2 is adjusted first by increasing the coarse gain from lower to higher values. After the $m_c$ exceeds M/8 the coarse gain is kept constant and the fine AGC unit minimizes the uniformity parameter $m_u$ and provides the best signal power indicating the minimum BER.

For unknown but distorted channel characteristics, the existence of the $m_u$ minimum enables the AGC to deliver useful amplitude statistics for the downstream digital equalizer. Problems of signal-to-noise ratio reduction with undistorted, almost ideal channels are obviated by the coarse AGC and especially by the lower bound on $m_c$. In this case, the coarse AGC will keep the signal power in some range and the fine AGC will be switched off practically. With an undistorted signal detector, e.g. based on amplitude histogram analysis, or by external configuration command, the fine AGC could really be switched off with the advantage of less dither penalty. Nevertheless, for time-variant channels with distortion the fine AGC demonstrates its performance.

Further modifications and variations of the present invention will be apparent to those skilled in the art in view of this description. Accordingly, this description is to be construed as illustrative only and is for the purpose of teaching those skilled in the art the general manner of carrying out the present invention. It is to be understood that the forms of the invention shown and described herein are to be taken as the presently preferred embodiments.

The invention claimed is:

1. A method for controlling amplification within a receiver (1) comprising:
    setting the gain of a variable gain amplifier (3) which amplifies an input signal (10) to obtain a gain-controlled signal (12);
    analog-to-digital converting (6) said gain controlled signal (12) thereby generating digital words (15, 20) each digital word having a value of a plurality possible digital values;
    counting digital words having a value within a first subset ($S_1$) of possible digital values thereby generating a first counter value (51); said counted digital words belonging to a predetermined number of digital words; said first subset ($S_1$) comprising at least one value;
    characterized by
    counting (52, 53, 54) digital words having a value within a second subset ($S_2$, $S_3$, $S_4$) of possible digital values thereby generating a second counter value;
    said counted digital words belonging to said predetermined number of digital words; said second subset being different from said first subset; said second subset comprising at least one value; and
    setting said gain in accordance with the first and second counter value in a fashion that all counter values are as equal as possible.

2. The method of claim 1, wherein each subset comprises at least two possible digital values.

3. The method of claim 1 or 2, said setting further comprising:
    summing all counter values (70) in order to obtain a uniformity parameter; and
    setting (8, 18) said gain in order to minimize said uniformity parameter.

4. The method of claim 1 or 2, said setting further comprising:
    subtracting a value (24, 55, 56, 57, 58) from each counter value (25, 51, 52, 53, 54) in order to obtain difference values (26); and
    summing the absolute values of all said difference values in order to obtain a uniformity parameter; and
    setting (8, 18) said gain in order to minimize said uniformity parameter.

5. The method of claim 1, characterized in that the absolute difference between any value within said first subset (42) and an average of all possible digital values is greater than the absolute difference between any value within said second subset (41) and said average and said setting said gain further comprising:

increasing said amplification with the count of said first counter (51) is greater than the count of said second counter (52, 53, 54); and decreasing said amplification if the count of said first counter is smaller than the count of said second counter.

6. The method of claim 5, said setting said gain further comprising:

calculating the difference of the first counter value minus the second counter value;

adding an offset to said difference in order to obtain a uniformity parameter;

said gain is increased or decreased by a value proportional to said uniformity parameter.

7. A circuit to be used within a receiver comprising:

a variable gain amplifier (3) for receiving an analog signal and outputting a gain controlled signal (12);

an analog-to-digital converter (6) connected to said variable gain amplifier (3) for digitizing said gain controlled signal, thereby generating digital words, each digital word having a value out of a plurality of possible digital values;

a first counter (51) connected to said analog-to-digital converter for counting digital words having a value within a first subset of possible digital values; said counted digital words belonging to a predetermined number of digital words; said first subset ($S_1$; 41) comprising at least one value;

characterized by:

a second counter (52, 53, 54) connected to said analog-to-digital converter (6) for counting digital words having a value within a second subset ($S_2, S_3, S_4$; 42) of possible digital values; said counted digital words belonging to said predetermined number of digital words; said second subset ($S_2, S_3, S_4$; 42) being different from said first subset ($S_1$; 41); said second subset comprising at least one value; and a gain calculation circuit (75) for setting said gain in accordance with the values of said first and second counters in a fashion that said values of said counters are as equal as possible.

8. A circuit of claim 7, further comprising an adder (70) which is connected to each of said counters for adding the counter values; said adder (70) providing its output to said gain calculation circuit (75) which sets said gain in accordance with the output signal of said adder (70).

9. The circuit of claim 7, further comprising:

a first register (55);

a second register (56, 57, 58);

a first absolute difference circuit (59) being connected to said first counter (51) and said first register (55) for calculating the absolute difference between the value of said first counter (51) and the value stored in said first register (55)

a second absolute difference circuit (60, 61, 62) being connected to said second counter (52, 53, 54) and said second register (56, 57, 58) for calculating the absolute difference between the value of said second counter (52, 53, 54) and the value stored in said second register (56, 57, 58); and an adder (70) connected to each of said absolute difference circuits (59, 60, 61, 62) for adding said absolute differences; said adder (70) providing its output to said gain calculating a circuit (75) which sets said gain in accordance with the output provided by said adder (70).

10. A circuit of claim 7, characterized in that the absolute difference between any value within a said first subset (41) and an average of all possible digital values smaller than the absolute difference between any value within said second subset (42) and said average and said circuit further comprising a subtractor for calculating the difference of said first counter value minus said second counter value;

said subtractor providing its output to said gain calculating circuit (75) for setting said gain in accordance with the output of said subtractor.

* * * * *